US009629243B2

(12) United States Patent
Kato

(10) Patent No.: US 9,629,243 B2
(45) Date of Patent: Apr. 18, 2017

(54) ELECTRONIC COMPONENT-EMBEDDED MODULE

(71) Applicant: Murata Manufacturing Co., Ltd., Kyoto (JP)

(72) Inventor: Noboru Kato, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 365 days.

(21) Appl. No.: 14/334,199

(22) Filed: Jul. 17, 2014

(65) Prior Publication Data
US 2014/0328038 A1 Nov. 6, 2014

Related U.S. Application Data

(63) Continuation of application No. PCT/JP2013/074653, filed on Sep. 12, 2013.

(30) Foreign Application Priority Data

Oct. 22, 2012 (JP) ................................. 2012-232566

(51) Int. Cl.
H01L 21/48 (2006.01)
H01L 23/50 (2006.01)
(Continued)

(52) U.S. Cl.
CPC .......... H05K 1/115 (2013.01); H01L 21/4857 (2013.01); H01L 23/5389 (2013.01);
(Continued)

(58) Field of Classification Search
CPC ....... H01L 2924/00; H01L 2924/12042; H01L 2924/1461; H01L 21/4857;
(Continued)

(56) References Cited

U.S. PATENT DOCUMENTS 8,975,529 B2 * 3/2015 Hayashi ............... H01L 23/145
174/255
2006/0243478 A1 * 11/2006 Inagaki ............... H01L 21/4857
174/255
(Continued)

FOREIGN PATENT DOCUMENTS

JP 2008-042904 A 2/2008
JP 2009-260318 A 11/2009
(Continued)

OTHER PUBLICATIONS

International Search Report issued in Application No. PCT/JP2013/074653 dated Oct. 8, 2013.
(Continued)

Primary Examiner — Eric Thomas
Assistant Examiner — Michael P McFadden
(74) Attorney, Agent, or Firm — Pearne & Gordon, LLP

(57) ABSTRACT

An electronic component-embedded module mountable on a motherboard has a multilayer board wherein a cavity is formed in order to place an electronic component. The multilayer board includes a board-side resin layer with external electrodes for mounting onto the motherboard and board-side via-conductors connected thereto, an intermediate resin layer with intermediate via-conductors connected to the board-side via-conductors, and a component-side resin layer stacked on the intermediate resin layer and having component-side via-conductors. The component-side via-conductors include first component-side via-conductors connected to the intermediate via-conductors and second component-side via-conductors bonded to the electronic component and connected to the first component-side via-conductors. An intermediate volume ratio obtained by dividing a total volume of the intermediate via-conductors by a volume of the intermediate resin layer is less than a component-side volume ratio obtained by dividing a total volume of the component-side via-conductors by a volume of the component-side resin layer.

21 Claims, 12 Drawing Sheets

(51) Int. Cl.
*H01L 23/13* (2006.01)
*H05K 1/18* (2006.01)
*H05K 1/11* (2006.01)
*H01L 23/00* (2006.01)
*H01L 23/538* (2006.01)
*H05K 3/46* (2006.01)

(52) U.S. Cl.
CPC ............ *H01L 24/19* (2013.01); *H05K 1/185* (2013.01); *H05K 1/186* (2013.01); *H01L 23/13* (2013.01); *H01L 23/5384* (2013.01); *H01L 2224/0401* (2013.01); *H01L 2224/04105* (2013.01); *H01L 2224/12105* (2013.01); *H01L 2224/16225* (2013.01); *H01L 2924/12042* (2013.01); *H01L 2924/1461* (2013.01); *H01L 2924/15311* (2013.01); *H01L 2924/19105* (2013.01); *H05K 3/4632* (2013.01); *H05K 2201/0141* (2013.01)

(58) Field of Classification Search
CPC ... H01L 2224/0401; H01L 2224/04105; H01L 2224/12105; H01L 2224/16225; H01L 23/13; H01L 23/5384; H01L 23/5389; H01L 24/19; H01L 2924/15311; H01L 2924/19105; H05K 1/185; H05K 1/186; H05K 3/4632; H05K 2201/0141

USPC ........................................................ 361/761
See application file for complete search history.

(56) References Cited

U.S. PATENT DOCUMENTS

2012/0161331 A1* 6/2012 Gonzalez ............... H01L 24/19
 257/774
2014/0226290 A1* 8/2014 Hayashi ............... H05K 3/4655
 361/748
2014/0321069 A1* 10/2014 Gouchi .................... H05K 1/16
 361/728

FOREIGN PATENT DOCUMENTS

WO 2012/120995 A1 9/2012
WO 2012/137548 A1 10/2012

OTHER PUBLICATIONS

Written Opinion issued in Application No. PCT/JP2013/074653 dated Oct. 8, 2013.

* cited by examiner

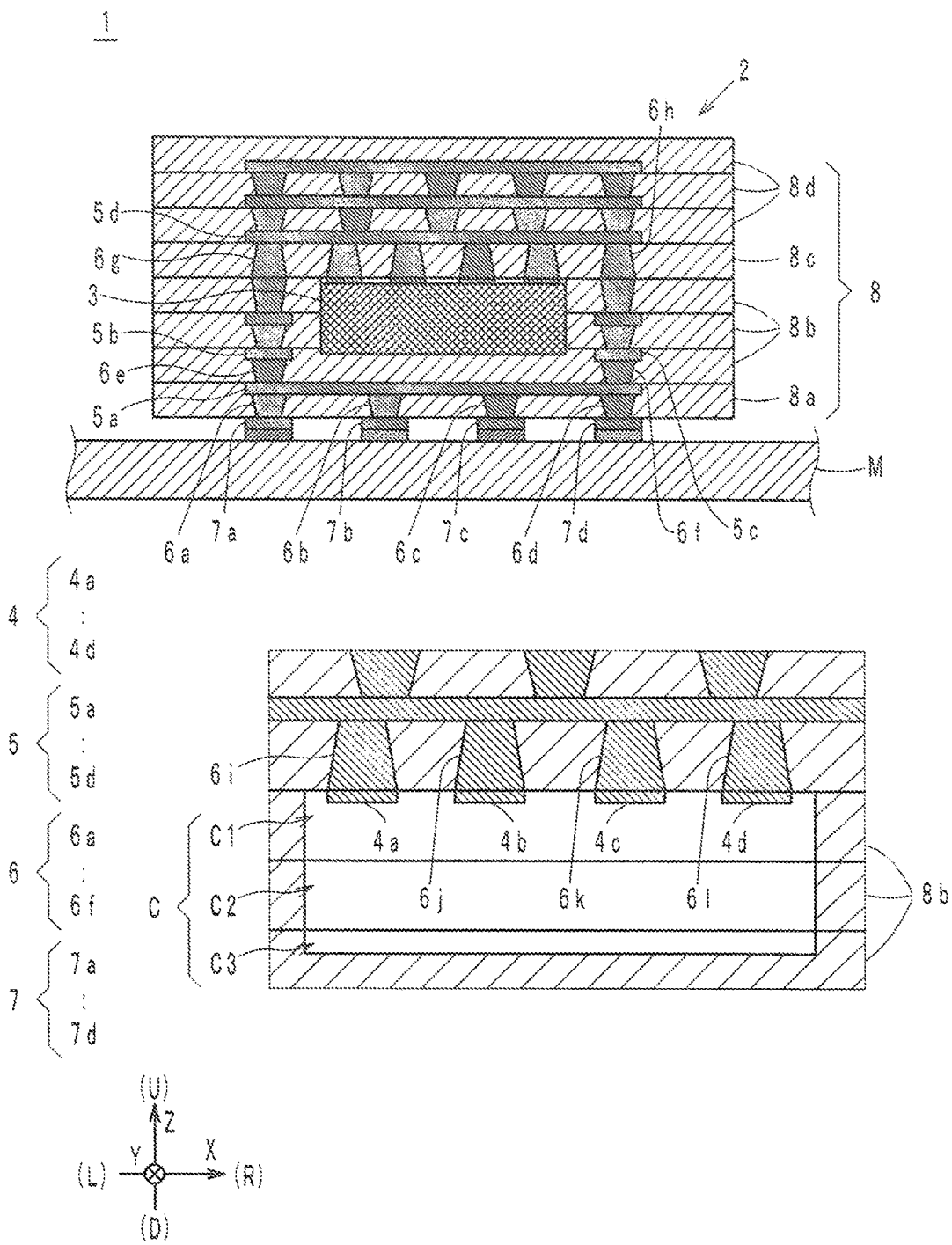

F I G . 4
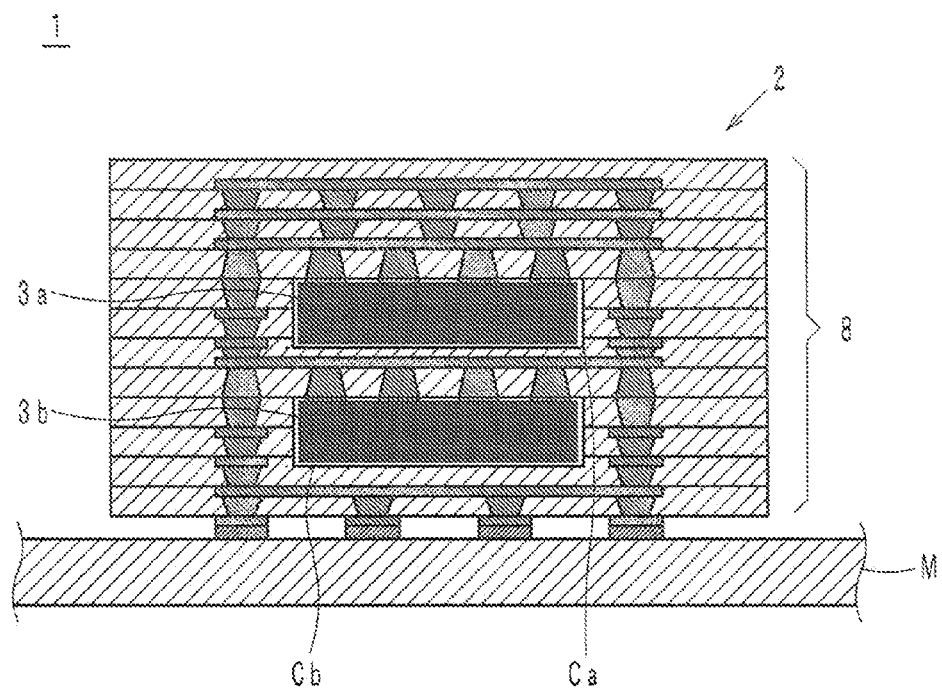
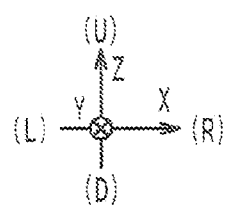

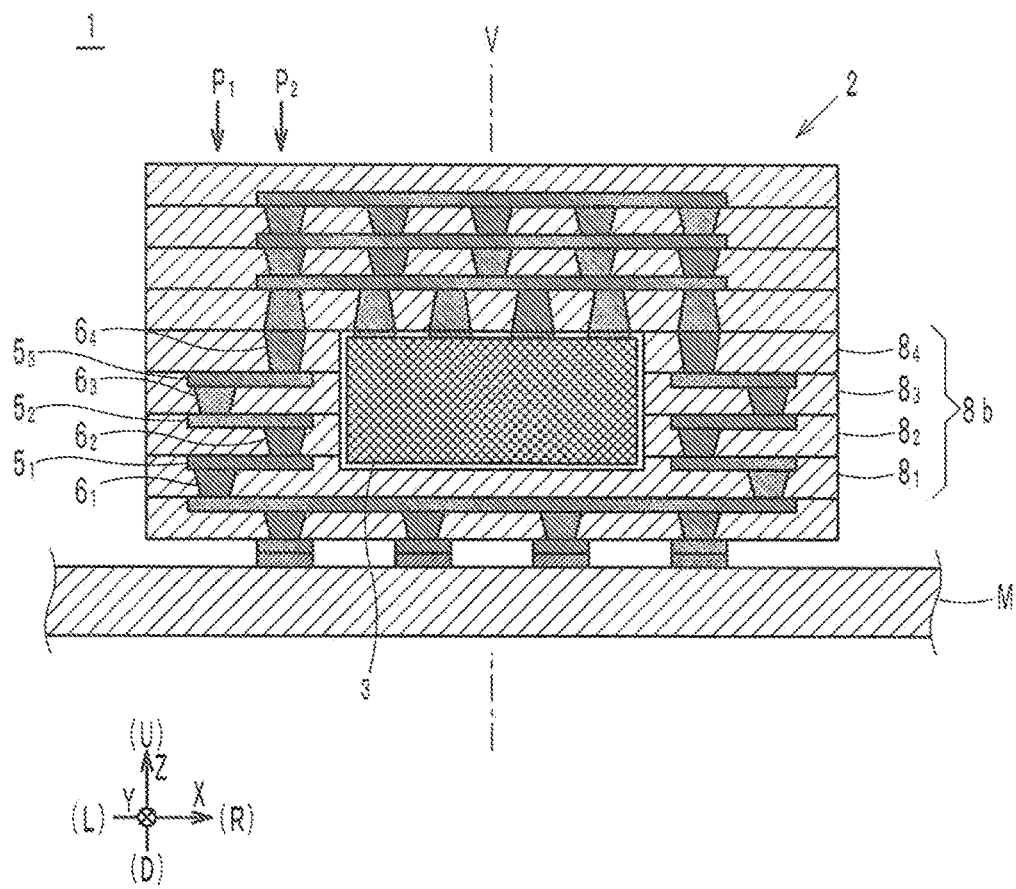
F I G . 5

F I G . 7
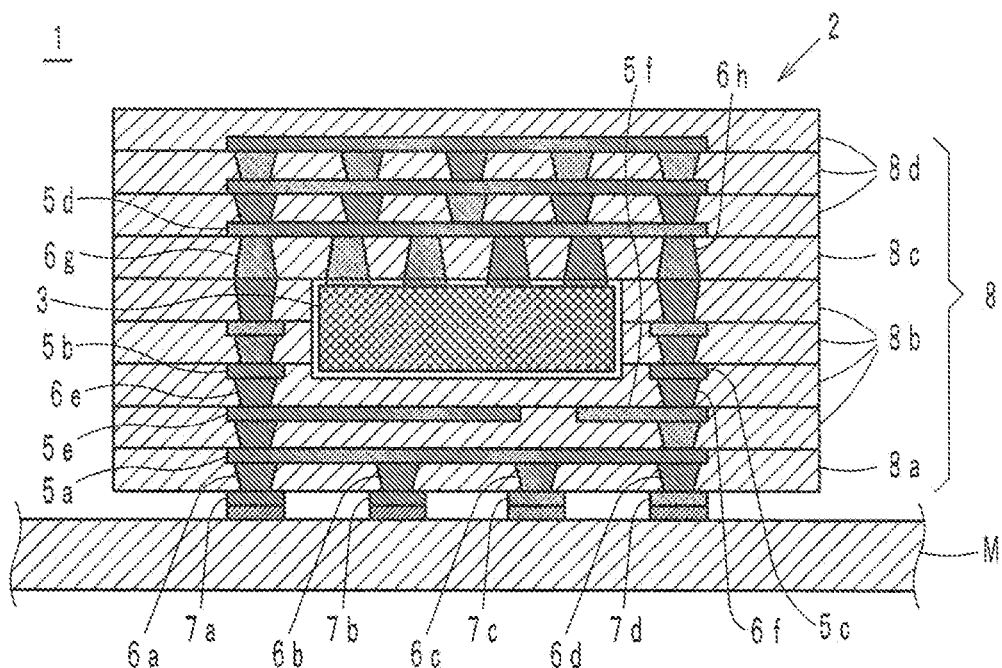
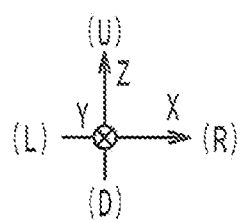

ELECTRONIC COMPONENT-EMBEDDED MODULE

This application is based on Japanese Patent Application No. 2012-232566 filed on Oct. 22, 2012 and International Application No. PCT/JP2013/074653 filed on Sep. 12, 2013, the content of each of which is incorporated herein by reference.

BACKGROUND OF THE INVENTION

1. Field of the Invention

The present invention relates to an electronic component-embedded module which includes an electronic component provided in a flexible multilayer board and is adapted to be mountable on a motherboard.

2. Description of Related Art

An example of a conventional electronic component-embedded module of this type is a component-embedded wiring board (simply referred to below as a wiring board) described in Japanese Patent Laid-Open Publication No. 2009-260318. This wiring board includes a core substrate having an approximately rectangular shape. The principal surface of the core substrate (referred to below as the principal surface of the core) has a principal-side built-up layer provided thereon, and the opposite surface to the principal surface (referred to below as the opposite surface of the core) has a bottom-side built-up layer provided thereon.

The core substrate has an accommodating hole (i.e., a cavity), which is a rectangular through-hole when viewed in a top view. In the accommodating hole, an IC chip (semiconductor integrated circuit element), which is an example of the electronic component, is placed. Note that the gap between the accommodating hole and the IC chip is filled with a resin filler, so that the IC chip is fixed to the core substrate.

The principal-side built-up layer has a structure in which three principal-side resin interlayers made of thermosetting resin and principal-side conductor layers made of copper are laminated alternatingly. Moreover, the principal-side resin interlayers include first via-conductors made by copper-plating. Some of the first via-conductors are connected to the IC chip.

Another example of the electronic component-embedded module is an Si-based package described in Japanese Patent Laid-Open Publication No. 2008-42904. This Si-based package includes an interposer (i.e., a multilayer board) provided in its lower part and having an etched cavity for an RFIC chip, which is another example of the electronic component. The cavity is metal coated to facilitate shielding. Moreover, the RFIC chip is flip-chip bonded to an added portion of the Si-based package using microbumps.

The electronic component-embedded module is mounted on a motherboard. However, the multilayer board and the motherboard are made from materials having different coefficients of thermal expansion from each other. Accordingly, if the motherboard is deformed (typically, warped), bonding portions of the electronic component and the multilayer board might be broken as a result of stress being applied thereto.

Particularly in recent years, the bonding portions of the electronic component and the multilayer board have been becoming smaller as the electronic component-embedded module comes to have a more compact size and a further advanced functionality. As the bonding portions become smaller in such a manner, the possibility of the bonding portions being broken even by small stress increases.

SUMMARY OF THE INVENTION

In an embodiment of the present invention, an electronic component-embedded module mountable on a motherboard includes a multilayer board in which a cavity is formed, and an electronic component placed in the cavity. The multilayer board includes a board-side resin layer with a plurality of external electrodes required for mounting onto the motherboard and a plurality of board-side via-conductors electrically connected to the external electrodes, an intermediate resin layer with a plurality of intermediate via-conductors electrically connected to the board-side via-conductors, and a component-side resin layer stacked on the intermediate resin layer and having a plurality of component-side via-conductors provided therein. The component-side via-conductors at least include a plurality of first component-side via-conductors electrically connected to the intermediate via-conductors and a plurality of second component-side via-conductors bonded to the electronic component and electrically connected to the first component-side via-conductors. An intermediate volume ratio obtained by dividing a total volume of the intermediate via-conductors by a volume of the intermediate resin layer is less than a component-side volume ratio obtained by dividing a total volume of the component-side via-conductors by a volume of the component-side resin layer.

BRIEF DESCRIPTION OF THE DRAWINGS

FIG. 1A is a vertical cross-sectional view illustrating an electronic component-embedded module according to a first embodiment;

FIG. 4 is a vertical cross-sectional view illustrating an electronic component-embedded module according to a first modification;

FIG. 5 is a vertical cross-sectional view illustrating an electronic component-embedded module according to a second modification;

FIG. 7 is a vertical cross-sectional view illustrating another configuration example of the electronic component-embedded module of FIG. 1.

DETAILED DESCRIPTION OF THE PREFERRED EMBODIMENTS

Preliminary Notes

Figure 1B:
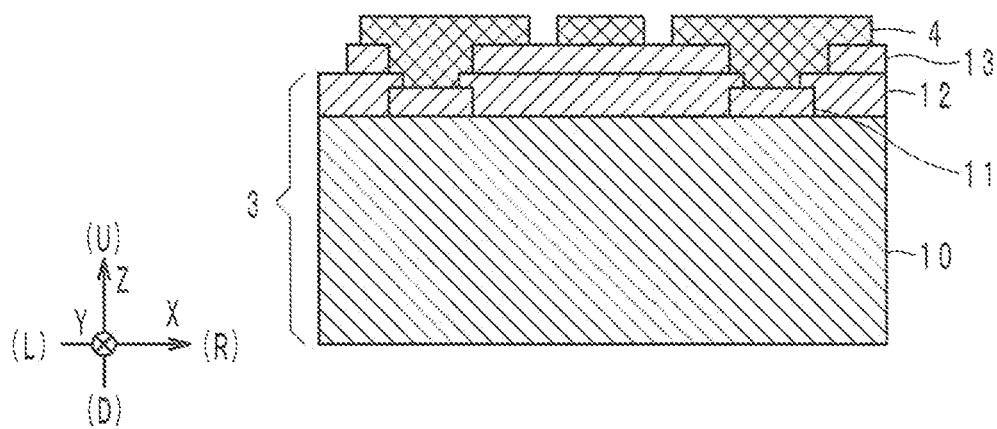
FIG. 1B is a schematic diagram illustrating in detail the configuration of an electronic component and wiring electrodes in FIG. 1.

First, X-, Y-, and Z-axes shown in some of the figures will be described. The X-, Y-, and Z-axes are perpendicular to one another. The Z-axis represents the lamination direction of resin layers. For the sake of convenience, the negative side in the Z-axis direction, i.e., the side that is proximal to a motherboard will be referred to as "down" side (D), and the positive side in the Z-axis direction, i.e., the side that is distal to the motherboard, as "up" side (U). Moreover, the X-axis represents the right-left direction. More specifically, the positive side in the X-axis direction will be referred to as "right" side (R), and the negative side as "left" side (L). Furthermore, the Y-axis represents the front-back direction. More specifically, the positive side in the Y-axis direction will be referred to as "far" side (F), and the negative side as "near" side (N).

First Embodiment

FIG. 1A is a vertical cross-sectional view illustrating an electronic component-embedded module (simply referred to below as a module) 1 according to a first embodiment of the present invention. Specifically, in FIG. 1A, the upper part shows the overall structure of the module 1, and the lower part shows the structure of a portion around a cavity C.

In FIG. 1A, the module 1 is adapted to be mountable on a motherboard M. The module 1 includes a multilayer board 2, at least one electronic component 3, a plurality of wiring electrodes 4, a plurality of pattern conductors 5, a plurality of via-conductors 6, and a plurality of external electrodes 7.

The multilayer board 2 is a laminate of resin layers 8, and is elastically deformable by an external force. The resin layers 8 include a board-side resin layer 8a for bonding to the motherboard, at least one intermediate resin layer 8b (in the figure, three are shown), a component-side resin layer 8c for bonding to an electronic component, and at least one additional resin layer 8d (in the figure, three are shown). Note that in FIG. 1A, the boundary between every two vertically adjacent resin layers 8 is delimited by an imaginary solid line for the sake of convenience.

The resin layers 8a to 8d are made of a flexible material which provides electric insulation (e.g., thermoplastic resin such as liquid crystal polymer). In addition, the resin layers 8a to 8d have the same rectangular shape when viewed in a top view, and also have a thickness in the range from about 10 micrometers [μm] to about 100 μm.

The board-side resin layer 8a is the closest of all of the resin layers 8a to 8d to the motherboard M when the module 1 is mounted on the motherboard M. The external electrodes 7, which are made of a conductive material such as copper, are disposed on the bottom surface of the resin layer 8a so as to correspond to the positions of lands on the motherboard M. In FIG. 1A, four external electrodes 7a to 7d are shown as the external electrodes 7

The intermediate resin layers 8b are stacked on the resin layer 8a. In the present embodiment, there are stacked three intermediate resin layers 8b, i.e., the lowermost intermediate resin layer 8b on the top surface of the resin layer 8a, the second intermediate resin layer 8b on the top surface of the lowermost intermediate resin layer 8b, and the uppermost intermediate resin layer 8b on the top surface of the second intermediate resin layer 8b. Accordingly, the higher the intermediate resin layer 8b, the more distant from the motherboard M.

In the multilayer board 2, the cavity C is provided in order to accommodate an electronic component 3 to be described later. The cavity C is formed by the three intermediate resin layers 8b, as shown in the lower part of FIG. 1A. More specifically, through-holes C1 and C2, which have approximately the same shape (e.g., rectangular) as the electronic component 3 when viewed in a top view, are provided in the same position (e.g., approximately at the center) of the upper two layers. Moreover, the lowermost intermediate resin layer 8b has provided therein a recess C3 having approximately the same shape as the electronic component 3 when viewed in a top view, the recess C3 being formed by the electronic component 3 sinking in the intermediate resin layer 8b through a heating and pressing process (see FIG. 2E). The through-holes C1 and C2 and the recess C3 are illustrative of the space defining the cavity C.

The component-side resin layer 8c is stacked on the top surface of the uppermost intermediate resin layer 8b, so as to close the upper opening of the cavity C. Further, the additional resin layers 8d are stacked on the top surface of the resin layer 8c. In the present embodiment, there are stacked three additional resin layers 8d, i.e., the lowermost additional resin layer 8d on the top surface of the resin layer 8c, the second additional resin layer 8d on the top surface of the lowermost additional resin layer 8d, and the uppermost additional resin layer 8d on the top surface of the second additional resin layer 8d.

The electronic component 3 is typically a semiconductor component of a chip-size package (CSP) type. The wiring electrodes 4 (see below) are provided on one surface of the electronic component 3. Examples of this type of semiconductor component include an RFIC chip and an image processing IC for use in a digital camera. Note that the electronic component 3 is not limited to the above semiconductor component of a CSP type, and may be of a micro-electro-mechanical systems (MEMS) type or a passive component such as a capacitor or a chip resistor.

In FIG. 1A, the lower part shows four wiring electrodes 4a to 4d as the wiring electrodes 4. Here, the electronic component 3 has top and bottom surfaces opposite to each other in the direction of lamination (i.e., the Z-axis direction) and side surfaces parallel to the direction of lamination. In the present embodiment, the wiring electrodes 4a to 4d are disposed on the top surface of the electronic component 3. The electronic component 3 is connected to component-side via-conductors 6i to 6l provided in the component-side resin layer 8c through the wiring electrodes 4a to 4d.

In FIG. 1A, only the electronic component 3 and the wiring electrodes 4 are shown in the cavity for the sake of clarification. However, the electronic component 3 and the wiring electrodes 4 are structured as shown in detail in FIG. 1B. More specifically, there are under bump metals (UBMs) 11 provided on an Si substrate 10 and coated with an $SiO_2$ layer 12 therearound. A polyimide layer 13 is provided on the $SiO_2$ layer 12. The wiring electrodes 4, which are made from copper or suchlike, are positioned on the polyimide layer 13.

While the electronic component 3 has been described above as being structured using UBMs, this is not limiting, and, for example, a rewiring layer may be formed directly over electrodes on the Si substrate 10.

FIG. 1A will be referenced again. The electronic component 3 and the wiring electrodes 4 are placed in the cavity C. Note that for convenience's sake, the lower part of FIG. 1A does not show the electronic component 3. The cavity C initially has a slightly larger size than the outer shape of the electronic component 3. Upon the heating and pressing process (see FIG. 2E), the intermediate resin layer 8b is fluidized and adheres tightly to the periphery of the electronic component 3, whereby the electronic component 3 is sealed. Moreover, the bottom and side surfaces of the electronic component 3 are not fixed to the intermediate resin layer 8b using another filler or suchlike. Accordingly, even if the dimension of the resin layer 8c in a certain direction changes because of deformation of the motherboard M or ambient heat, the electronic component 3 moves within the cavity C in accordance with such a change. In other words, the electronic component 3 slides on the intermediate resin layer 8b. Note that to allow the electronic component 3 to readily slide on the intermediate resin layer 8b, for example, the bottom surface of the electronic component 3 is preferably mirror finished.

At least one of the pattern conductors 5, which are made of conductive material such as copper, is positioned in the multilayer board 2. More specifically, the pattern conductors 5 are provided on the top and bottom surfaces of the required resin layers 8. The pattern conductors 5 are provided as wiring conductors for electrically connecting land electrodes on the motherboard M to the electronic component 3.

Note that to keep FIG. 1A from becoming overly complicated, reference characters are not assigned to all pattern conductors in FIG. 1A but to only four of them, i.e., the pattern conductors 5a, 5b, 5c, and 5d. The pattern conductor 5a is positioned between the top surface of the resin layer 8a and the bottom surface of the lowermost intermediate resin layer 8b, so as to extend in the right-left direction. Moreover, both of the pattern conductors 5b and 5c are positioned between the top surface of the lowermost intermediate resin layer 8b and the bottom surface of the second intermediate resin layer 8b. In particular, the pattern conductor 5b is positioned to the left of the cavity C, and the pattern conductor 5c is positioned to the right of the cavity C. Furthermore, the pattern conductor 5d is positioned between the top surface of the resin layer 8c and the bottom surface of the lowermost additional resin layer 8d, so as to extend in the right-left direction. In the right-left direction, the pattern conductors 5a and 5d are significantly longer than the pattern conductors 5b and 5c. Note that the pattern conductors 5 are not limited to the wiring conductors, and may be pattern conductors for forming a capacitor or a coil.

The via-conductors 6 are typically made of a conductive material such as an alloy mainly composed of tin and silver. The via-conductors 6 are basically used for electrically connecting the electronic component 3 to the land electrodes on the motherboard M, and provided so as to vertically pierce through their respectively corresponding resin layers 8 in predetermined positions.

Note that to keep FIG. 1A from becoming overly complicated, reference characters are not assigned to all via-conductors in FIG. 1A but to only twelve of them, i.e., the via-conductors 6a to 6l.

All of the via-conductors 6a to 6d are provided in the board-side resin layer 8a. In view of this, they will also be referred to below as the board-side via-conductors 6a to 6d. More specifically, the board-side via-conductors 6a to 6d are provided in the board-side resin layer 8a so as to be arranged in a straight line in the right-left direction. The board-side via-conductor 6a bonds the external electrode 7a and the pattern conductor 5a, thereby electrically connecting them. Similarly, the board-side via-conductors 6b to 6d respectively bond the external electrodes 7b to 7d and the pattern conductor 5a, thereby electrically connecting them.

Both of the via-conductors 6e and 6f are provided in the lowermost intermediate resin layer 8b. In view of this, they will also be referred to below as the intermediate via-conductors 6e and 6f. More specifically, the intermediate via-conductor 6e bonds the pattern conductors 5a and 5b, thereby electrically connecting them. Similarly, the intermediate via-conductor 6f bonds the pattern conductors 5a and 5c, thereby electrically connecting them.

Furthermore, the via-conductors 6g to 6l are provided in the resin layer 8c so as to be arranged in a straight line in the right-left direction. In view of this, they will also be referred to below as the component-side via-conductors 6g to 6l. The component-side via-conductors 6g to 6l are divided into two groups: first component-side via-conductors 6g and 6h; and second component-side via-conductors 6i to 6l. In particular, the first component-side via-conductors 6g and 6h bond the pattern conductor 5d and their corresponding via-conductors provided in the intermediate resin layer 8b positioned immediately therebelow, thereby electrically connecting them. Moreover, the second component-side via-conductor 6i bonds the pattern conductor 5d and the wiring electrode 4a, thereby electrically connecting them. Similarly, the second component-side via-conductors 6j to 6l bond the pattern conductor 5d and the wiring electrodes 4b to 4d, thereby electrically connecting them.

The via-conductors 6 in the resin layers 8b and 8c are provided for adjusting the flexibility (or the rigidity) of the resin layers 8b and 8c, as well as for achieving electrical connections between the electronic component 3 and the motherboard M. More specifically, the via-conductors 6 are provided in the resin layers 8b and 8c such that the volume ratio for the resin layer 8b (intermediate volume ratio) is lower than the volume ratio for the resin layer 8c (component-side volume ratio). The intermediate volume ratio as used herein refers to a value obtained by dividing the total volume of the via-conductors (intermediate via-conductors) 6 provided in the intermediate resin layer 8b by the volume of the intermediate resin layer 8b. Moreover, the component-side volume ratio refers to a value obtained by dividing the total volume of the via-conductors (component-side via-conductors) 6 provided in the component-side resin layer 8c by the volume of the component-side resin layer 8c.

For example, if all of the via-conductors 6 provided in the resin layers 8b and 8c are essentially equal in size, the above density relationship can be established by forming fewer via-conductors 6 in the resin layer 8b than in the resin layer 8c.

Further, it is preferable that the via-conductors 6 be provided in the resin layers 8b and 8d such that the volume ratio for the additional resin layer 8d (additional volume ratio) is higher than the intermediate volume ratio. Here, the additional volume ratio refers to a value obtained by dividing the total volume of the via-conductors (additional via-conductors) 6 provided in the additional resin layer 8d by the volume of the additional resin layer 8d.

If all of the via-conductors 6 provided in the resin layers 8b and 8d are essentially equal in size, the above density relationship can be established by forming fewer vias in the resin layer 8b than in the resin layer 8d.

Furthermore, the via-conductors 6 may be provided in the resin layers 8c and 8d such that the additional volume ratio is lower than the component-side volume ratio. In such a case, the component-side volume ratio is the highest of all of the volume ratios for the resin layers 8b to 8d.

Furthermore, the external electrodes 7 (in FIG. 1A, the external electrodes 7a to 7d are shown) are formed on the bottom surface of the resin layer 8a so as to correspond to the positions of the lands on the motherboard M, as described above. The external electrodes 7a to 7d are electrically connected to the via-conductors 6 provided in the resin layer 8a.

Method for Producing Module

Next, the method for producing the module 1 will be described with reference to FIGS. 2A to 2D. While the following description focuses on one module 1 as an example, in actuality, large-sized resin sheets are laminated and cut, so that a number of modules 1 are produced at the same time.

Prepared first are a necessary number of large-sized resin sheets having approximately their entire surfaces copper-foiled and a necessary number of large-sized resin sheets with their surfaces left unprocessed. The resin sheets serve as resin layers 8 after completion of the module 1. More specifically, to produce the module 1 shown in FIG. 1A, resin sheets 9a to 9d corresponding to the resin layers 8a to 8d (see FIG. 2A) are prepared. The resin sheets 9a to 9d are sheets of liquid crystal polymer having a thickness in the range from about 25 μm to about 100 μm. The thickness of the copper foil is from 10 μm to 20 μm. Note that the copper-foiled surfaces of the resin sheets are preferably smoothened, for example, by galvanization for rust prevention.

Figure 2A:
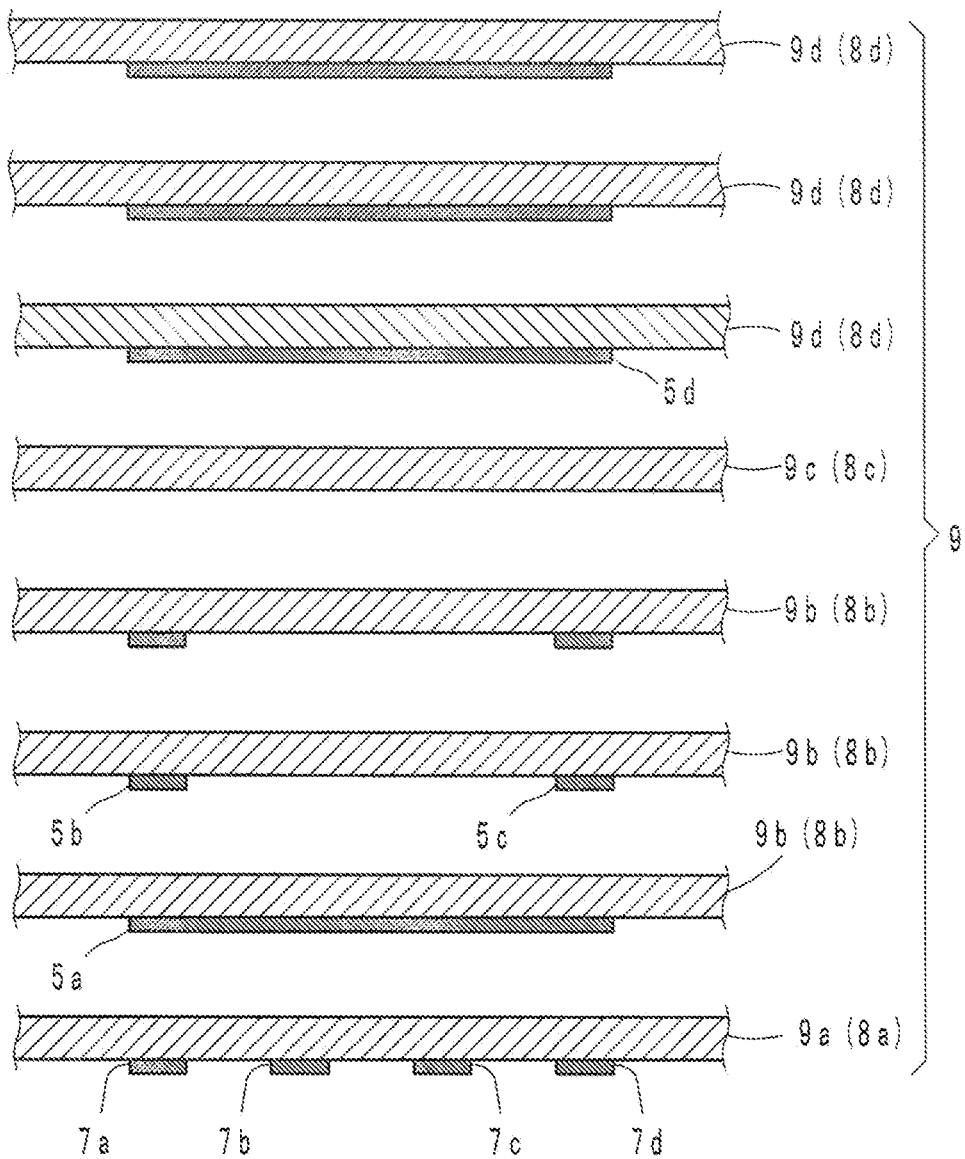
FIG. 2A is a schematic diagram illustrating the initial steps for producing the module of FIG. 1.

Next, a predetermined number of external electrodes 7 are formed on one surface of at least one resin sheet 9a by photolithography, as shown in FIG. 2A. More specifically, resists are printed on the copper foil on the resin sheet 9a in the same shapes as external electrodes 7 (including external electrodes 7a to 7d). Thereafter, any portions of the copper foil that are not coated with the resists are removed by etching the copper foil. Subsequently, the resists are removed. In this manner, the external electrodes 7 are formed on the surface of the resin sheet 9a.

Further, a pattern conductor 5a is similarly formed on one surface of a resin sheet 9b by photolithography, as shown in FIG. 2A. Note that this resin sheet 9b serves as a lowermost resin layer 8b after completion of the module 1. Moreover, pattern conductors 5b and 5c are formed on one surface of another resin sheet 9b. In addition, pattern conductors similar to the pattern conductors 5b and 5c are formed on one surface of still another resin sheet 9b.

Note that in this example of the present embodiment, the resin sheet 9c is not copper-foiled, as shown in FIG. 2A.

Further, a pattern conductor 5d is similarly formed on one surface of a resin sheet 9d by photolithography, as shown in FIG. 2A. Note that this resin sheet 9d serves as a lowermost resin layer 8d after completion of the module 1. Moreover, a pattern conductor similar to the pattern conductor 5d is formed on one surface of each of another two resin sheets 9d.

Figure 2B:
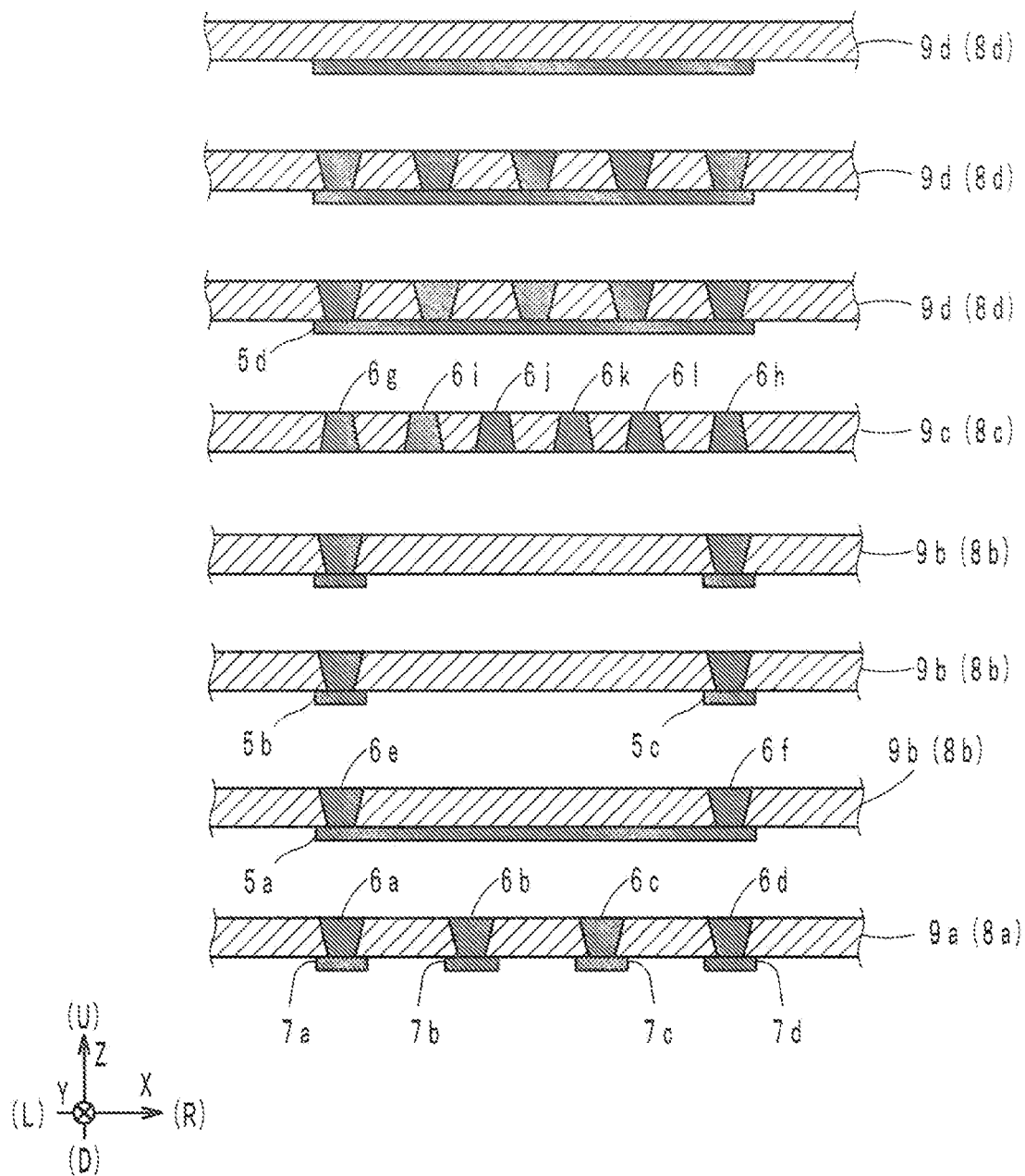
FIG. 2B is a schematic diagram illustrating steps subsequent to FIG. 2A.

Next, the resin sheet 9a is irradiated with laser beams in positions where via-conductors are to be formed (see hatched portions with lines sloping downward to the right), from the other surface (where the external electrodes 7a to 7d are not present), as shown in FIG. 2B. As a result, via-holes are provided, and thereafter, the via-holes are filled with a conductive paste.

Further, the resin sheet 9b that is to serve as a lowermost resin layer 8b is irradiated with laser beams in positions where via-conductors 6a and 6b are to be formed, from the other surface (where the pattern conductor 5a is not present). Via-holes thus provided are filled with a conductive paste.

Similarly, the resin sheet 9b that is to serve as a second resin layer 8b is irradiated with laser beams in predetermined positions, from the surface where the pattern conductor 5b and 5c are not present. Via-holes thus provided are filled with a conductive paste. A plurality of via-holes are similarly provided in an uppermost resin layer 8b, and filled with a conductive paste.

Further, via-holes are similarly provided in the resin sheet 9c that is to serve as a resin layer 8c in positions where via-conductors (including via-conductors 6c to 6f) are to be formed, and thereafter, the via-holes are filled with a conductive paste. A plurality of via-holes are similarly provided in each of the other two resin sheets 9d, and filled with a conductive paste.

Figure 2C:
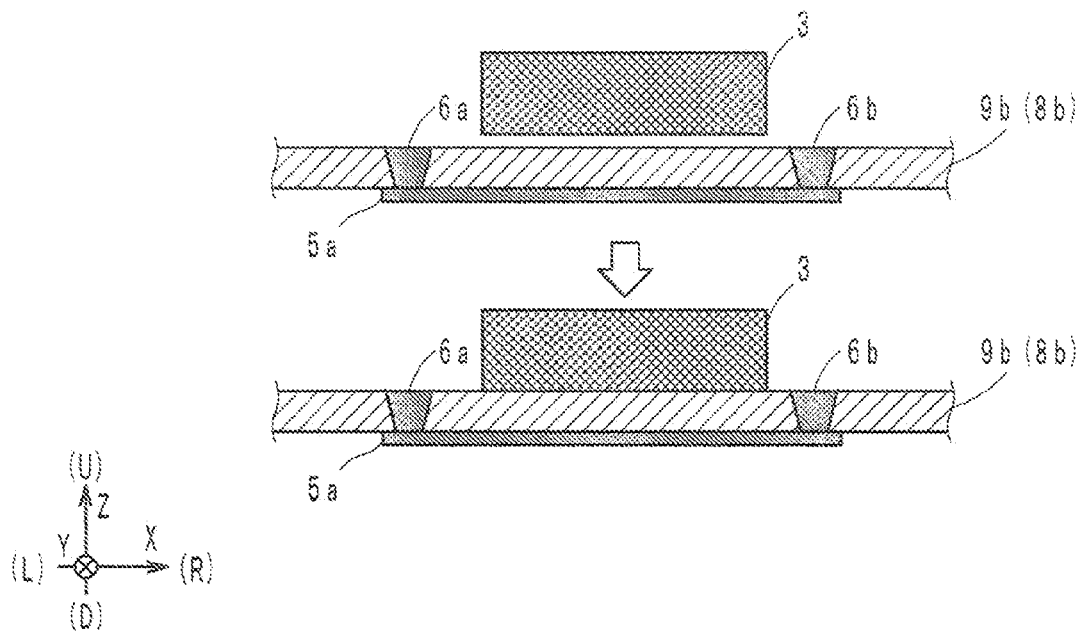
FIG. 2C is a schematic diagram illustrating steps subsequent to FIG. 2B.

Next, an electronic component 3 is placed and temporarily pressed on the surface (where the pattern conductor 5a is not present) of the resin sheet 9b that is to serve as a lowermost resin layer 8b, as shown in FIG. 2C. As a result, the electronic component 3 is positioned with respect to the resin sheet 9b.

Figure 2D:
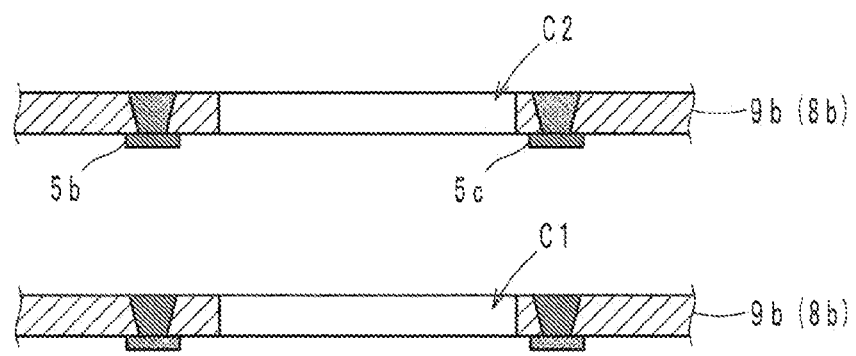
FIG. 2D is a schematic diagram illustrating steps subsequent to FIG. 2C.
Figure 2D:
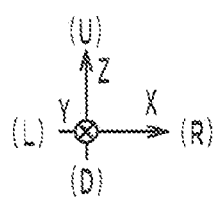

Further, the resin sheets 9b that are to serve as the other resin layers 8b are irradiated with laser beams in the position where the electronic component 3 is to be placed, so that through-holes C1 and C2 are provided, as shown in FIG. 2D.

Figure 2E:
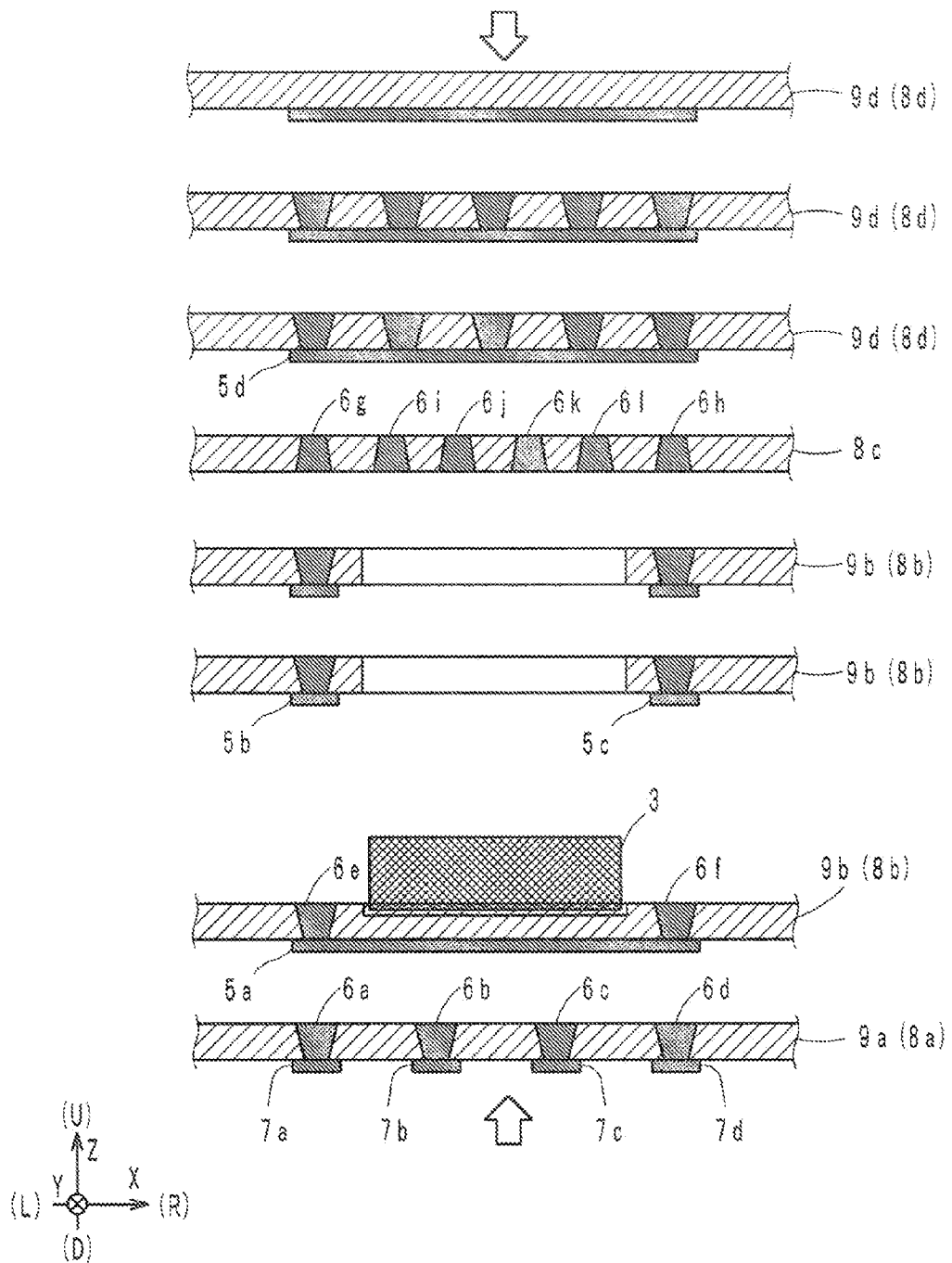
FIG. 2E is a schematic diagram illustrating steps subsequent to FIG. 2D.

Next, the resin sheet 9a, the resin sheet 9b (lowermost resin layer 8b), the resin sheet 9b (second resin layer 8b), the resin sheet 9b (uppermost resin layer 8b), the resin sheet 9c, the resin sheet 9d (lowermost resin layer 8d), the resin sheet 9d (second resin layer 8d), and the resin sheet 9d (uppermost resin layer 8d) are stacked in this order from bottom upward, as shown in FIG. 2E. Here, for the resin sheets 9 on which the external electrodes 7 and the pattern conductors 5 are formed, they are stacked such that the sides with the external electrodes 7 and the pattern conductors 5 face down.

Subsequently, the stacked resin sheets 9a to 9d are heated and pressed from both the top and bottom sides. Through the heating and pressing, the resin sheets 9a to 9d are softened so as to be bonded and united, and the conductive pastes in the via-holes are solidified. As a result, the via-conductors 6 (including the via-conductors 6a to 6f) are formed. Moreover, at this time, the electronic component 3 sinks in the resin sheet 9b, so that a recess C3 is formed. Note that the resin sheets 9 may be united using an adhesive such as epoxy-based resin, rather than by means of bonding through heating and pressing.

Lastly, the united resin sheets 9a to 9d are cut into a predetermined size, so that a module 1 as shown in FIG. 1A is completed.

Actions and Effects of Module

Figure 3:
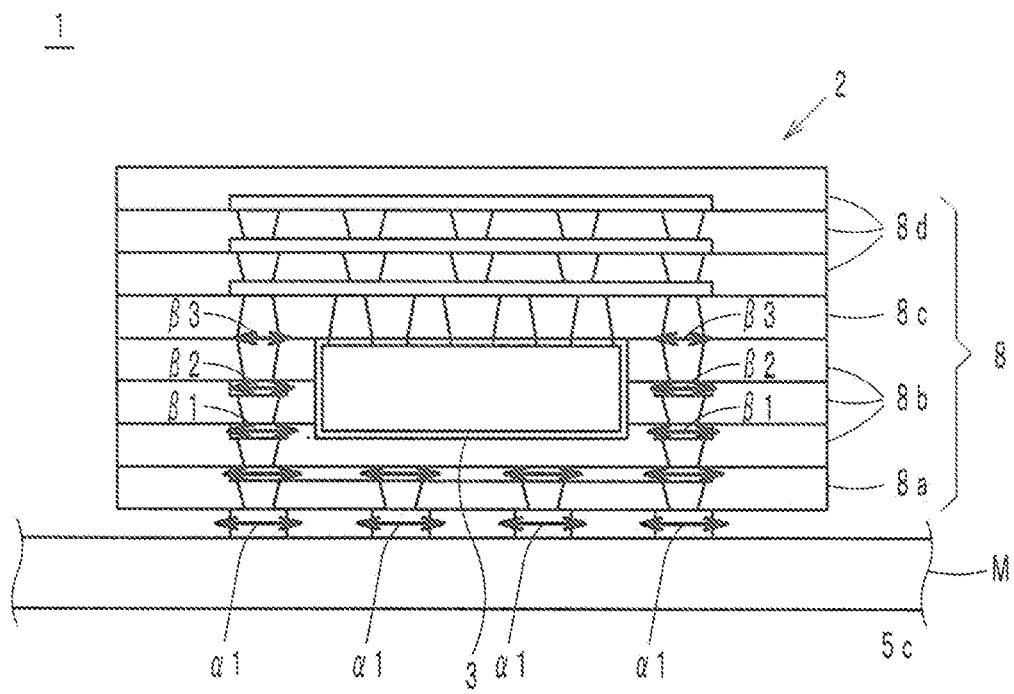
FIG. 3 is a schematic diagram illustrating stress applied within a multilayer board shown in FIG. 1.
Figure 3:
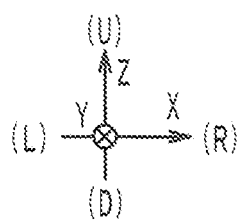

Next, the actions and the effects of the module 1 will be described with reference to FIG. 3. The module 1 is mounted on the motherboard M. Here, the multilayer board 2 and the motherboard M differ in coefficient of thermal expansion. Accordingly, if the multilayer board 2 and the motherboard M are deformed because of heat, large stress is applied to the bonding portions of the module 1 and the motherboard M (i.e., the interfaces therebetween), as indicated by arrows α1. Also, in the case where the multilayer board 2 and the motherboard M are deformed (typically, warped), large stress is applied to the interfaces as well.

In the present embodiment, to allow the bonding portions of the electronic component 3 and the multilayer board 2 not to be affected by the stress (indicated by arrows α1), the component-side resin layer 8c has a larger volume ratio than the intermediate resin layer 8b. Accordingly, the intermediate resin layer 8b is more flexible than the component-side resin layer 8c. The intermediate resin layers 8b as such absorb the stress applied to the interfaces between the module 1 and the motherboard M.

Particularly in the case where three intermediate resin layers 8b are provided, as in the present embodiment, the closest resin layer 8b to the motherboard M absorbs the stress most. Accordingly, stress (indicated by arrows $\beta 1$) applied to the bonding portions of the lowermost and second intermediate resin layers 8b is weaker than the stress indicated by arrows $\alpha 1$. Similarly, stress (indicated by arrows $\beta 2$) applied to the bonding portions of the second and uppermost intermediate resin layers 8b is weaker than the stress indicated by arrows $\beta 1$. Accordingly, only stress (indicated by arrows $\beta 3$) considerably weaker than the stress indicated by arrows $\alpha 1$ is applied to the resin layer 8c. Therefore, even if large stress is applied to the interfaces between the module 1 and the motherboard M, the stress is significantly reduced by the intermediate resin layers 8b, so that only quite small or almost negligible stress is transmitted to the resin layer 8c. Thus, the bonding portions of the electronic component 3 and the multilayer board 2 can be prevented from being broken. Here, it is preferable that the electronic component 3 and the via-conductors 6 in the resin layers 8 be electrically connected only on the resin layer 8c side (i.e., on the top side of the cavity in which the electronic component 3 is placed).

Furthermore, from the opposite perspective, it can be said that the resin layer 8c has provided therein the via-conductors 6 that sufficiently enhance its rigidity. Accordingly, if unexpected stress is transmitted to the layers between the electronic component 3 and the multilayer board 2, the resin layer 8c is sufficiently resistant to such stress. Thus, it is possible to more reliably prevent breakage at the bonding portions of the electronic component 3 and the multilayer board 2.

Furthermore, the cavity C is adapted to allow the electronic component 3 to be slid therewithin. Accordingly, if the dimensions of the resin layer 8c change, the electronic component 3 slides within the cavity C in accordance with such a change. Thus, it is possible to inhibit stress from being applied to the wiring electrodes 4 between the electronic component 3 and the resin layer 8c, thereby preventing breakage of their bonding portions.

Furthermore, in a preferred configuration of the first embodiment, the via-conductors 6 are provided in the resin layers 8b and 8d, such that the intermediate volume ratio is lower than the additional volume ratio. As a result, the rigidity of the layers above the resin layer 8c is enhanced, and therefore, the resin layer 8c becomes more resistant to stress. Thus, it is possible to more reliably prevent breakage of the bonding portions between the electronic component 3 and the multilayer board 2.

First Modification

The first embodiment has been described with respect to the case where one cavity C is provided in the multilayer board 2, as shown in FIG. 1A, and the electronic component 3 is placed in the cavity C. However, this is not limiting, and a plurality of cavities Ca and Cb may be provided in the multilayer board 2, as shown in FIG. 4. In such a case, at least one electronic component is placed in each of the cavities Ca and Cb, as indicated at 3a and 3b.

In the case where the electronic components 3a and 3b are embedded, as described above, it is preferable from the viewpoint of achieving a low-profile multilayer board 2 that their Si substrates be thinner, and thinner electrode layers and thinner insulating layers be provided using a technology for the formation of thin-film electrodes.

Second Modification

In the first embodiment, a plurality of via-conductors 6 are provided in the multilayer board 2 approximately in the same position when viewed in a top view, as shown in FIG. 1A. However, this is not limiting, and the via-conductors 6 may be provided in a so-called zigzag pattern between every two vertically adjacent resin layers 8 as shown in FIG. 5.

To describe the via-conductors 6 in a zigzag pattern more specifically, via-conductors $6_1$, $6_3$, and so on, when viewed in a top view, are provided approximately in the same position $P_1$ in odd resin layers $8_1$, $8_3$, and so on, in order from one resin layer $8_1$ upward. Moreover, via-conductors $6_2$, $6_4$, and so on, when viewed in a top view, are provided approximately in the same position $P_2$ (different from position $P_1$) in even resin layers $8_2$, $8_4$, and so on. In addition, the vertically adjacent via-conductors 6 (e.g., the via-conductors $6_1$ and $6_2$) are connected by pattern conductors 5. Such via-conductors 6 in a zigzag pattern render it possible to enhance the flatness of both the top and bottom surfaces of the multilayer board 2.

The via-conductors $6_1$ to $6_4$ described above are formed in a zigzag pattern to the left of the electronic component 3. A plurality of via-conductors are formed to the right of the electronic component 3 so as to be symmetrical to the via-conductors $6_1$ to $6_4$ with respect to vertical center plane V parallel to the YZ plane and located in the center in the right-left direction.

Figure 6:
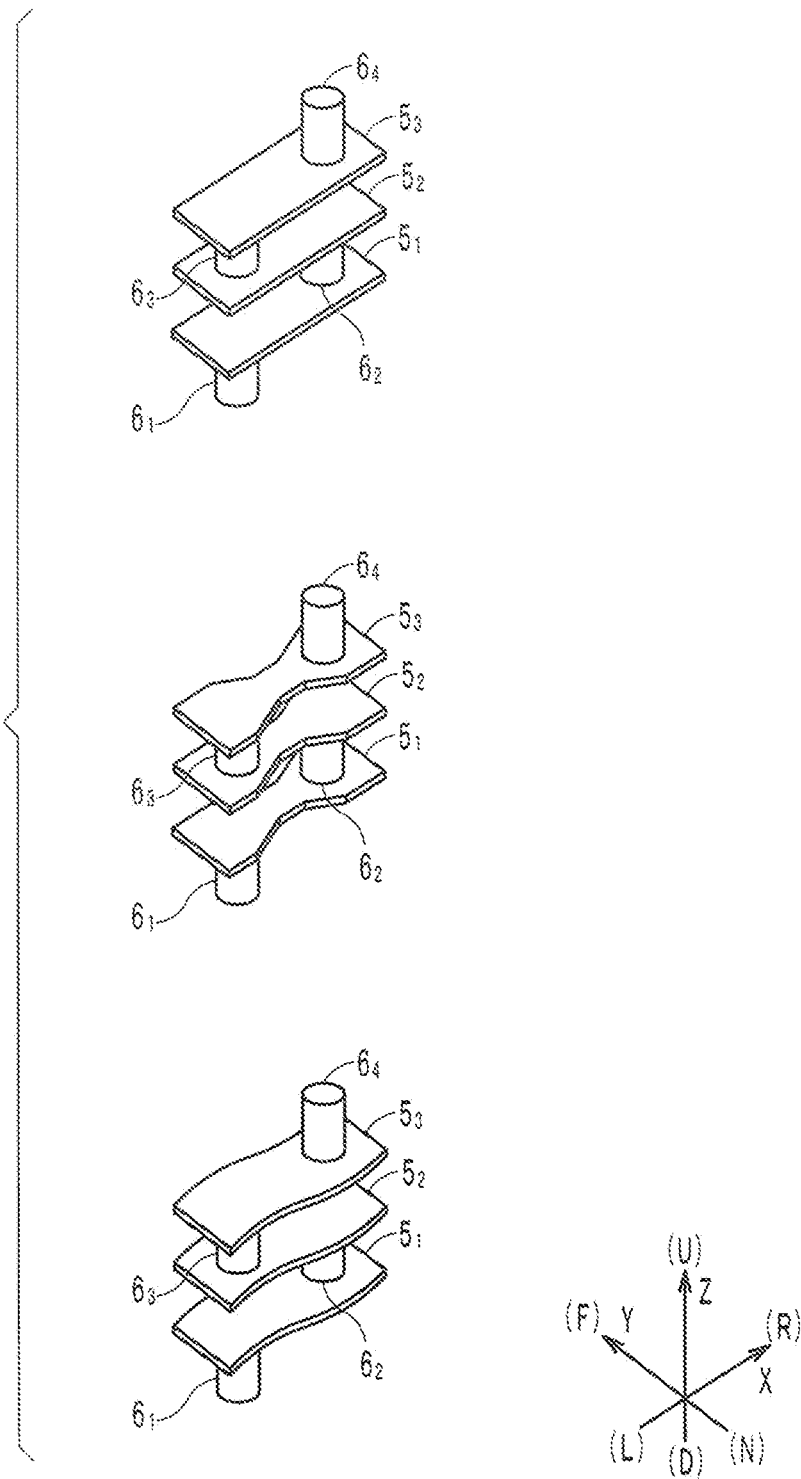
FIG. 6 provides oblique views illustrating configuration examples of via-conductors in a zigzag pattern shown in FIG. 5.

Here, via-conductors 6 adjacent in the Z-axis direction may be connected by pattern conductors 5 in the shape of rectangles when viewed in a top view, as shown in the upper part of FIG. 6. Alternatively, such via-conductors 6 adjacent in the Z-axis direction may be connected by pattern conductors 5 constricted in the middle when viewed in a top view, as shown in the middle part of FIG. 6, or by pattern conductors 5 curved in a wave-like fashion when viewed in a top view, as shown in the lower part of FIG. 6. These shapes make the pattern conductors 5 less resistant to torsion. Accordingly, torsion stress is absorbed in the middle of the pattern conductors 5, and therefore, little stress is applied to the bonding portions of the via-conductors 6 and the pattern conductors 5.

Other Configurations

In another configuration, pattern conductors 5e and 5f may be provided below the electronic component 3 but above the board-side resin layer 8a, so as to partially overlap with the electronic component 3 when viewed in a top view, as shown in FIG. 7. In the example of FIG. 7, the pattern conductors 5e and 5f are positioned between the lowermost intermediate resin layer 8b and the second intermediate resin layer 8b. Both principal surfaces of each of the pattern conductors 5e and 5f differ in surface roughness. More specifically, one of the principal surfaces is a slip plane having a low value of surface roughness. When distortion stress is applied to the slip plane, the stress can be avoided by the slip plane, and therefore, can be inhibited from being applied to the bonding portions of the electronic component 3 and the multilayer board 2. Moreover, the pattern conductors 5e and 5f are formed within the same layer in a completely separated fashion. Such a configuration even makes it possible to deal with larger distortion.

The pattern conductors 5e and 5f can enhance the capability of shielding the electronic component 3. Moreover, by using ground conductors as either or both of the pattern conductors 5e and 5f, the influence of parasitic components (such as parasitic capacitance and parasitic resistance) generated in the pattern conductors 5 can be reduced.

Figure 8:
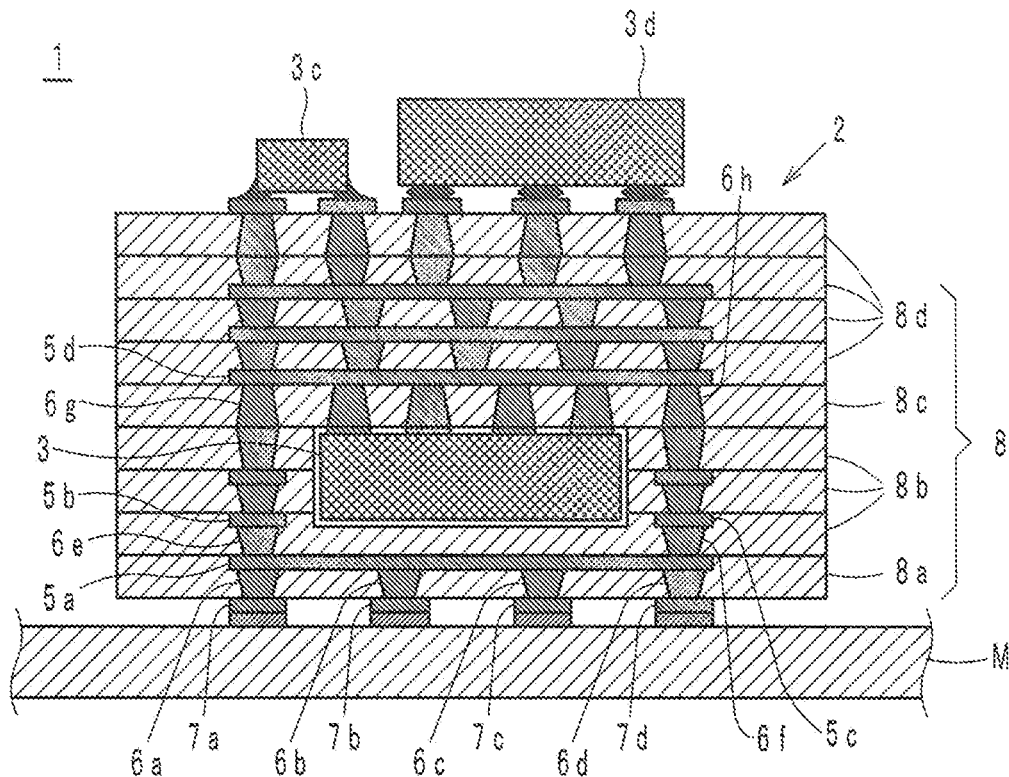
FIG. 8 is a vertical cross-sectional view illustrating still another configuration example of the electronic component-embedded module of FIG. 1.

Furthermore, other electronic components 3c and 3d may be mounted on the surface (e.g., the top surface) of the multilayer board 2 that is opposite to the surface on which side the multilayer board 2 is mounted on the motherboard M, as shown in FIG. 8.

Although the present invention has been described in connection with the preferred embodiment above, it is to be noted that various changes and modifications are possible to those who are skilled in the art. Such changes and modifications are to be understood as being within the scope of the invention.

What is claimed is:

1. An electronic component-embedded module mountable on a motherboard, comprising:
   a multilayer board in which a cavity is formed; and
   an electronic component placed in the cavity, wherein the multilayer board includes:
   a board-side resin layer with a plurality of external electrodes configured to mount the board-side resin layer onto the motherboard and a plurality of board-side via-conductors electrically connected to the external electrodes;
   an intermediate resin layer with a plurality of intermediate via-conductors electrically connected to the board-side via-conductors; and
   a component-side resin layer stacked on the intermediate resin layer and having a plurality of component-side via-conductors provided therein,
   the component-side via-conductors at least include a plurality of first component-side via-conductors electrically connected to the intermediate via-conductors and a plurality of second component-side via-conductors bonded to the electronic component and electrically connected to the first component-side via-conductors, and
   an intermediate volume ratio obtained by dividing a total volume of the intermediate via-conductors by a volume of the intermediate resin layer is less than a component-side volume ratio obtained by dividing a total volume of the component-side via-conductors by a volume of the component-side resin layer.

2. The electronic component-embedded module according to claim 1, wherein
   the multilayer board further includes an additional resin layer stacked on the component-side resin layer and having at least one additional via-conductor provided therein, and
   an additional volume ratio obtained by dividing a volume of the at least one additional via-conductor by a volume of the additional resin layer is higher than the intermediate volume ratio.

3. The electronic component-embedded module according to claim 1, wherein
   the multilayer board further includes an additional resin layer stacked on the component-side resin layer and having at least one additional via-conductor provided therein, and
   an additional volume ratio obtained by dividing a volume of the at least one additional via-conductor by a volume of the additional resin layer is lower than the component-side volume ratio.

4. The electronic component-embedded module according to claim 1, wherein
   the electronic component has two opposite surfaces in a direction of lamination of the intermediate resin layer and the component-side resin layer, and the electronic component is connected to the second component-side via-conductors via a plurality of wiring electrodes formed on one of the two surfaces, and
   the other of the two surfaces is not fixed to the intermediate resin layer having the cavity provided therein.

5. The electronic component-embedded module according to claim 4, wherein the electronic component has side surfaces parallel to the direction of lamination, the side surfaces being not fixed to the intermediate resin layer having the cavity provided therein.

6. The electronic component-embedded module according to claim 1, wherein
   a plurality of cavities is formed in the multilayer board, and
   an electronic component is placed in each of the cavities.

7. The electronic component-embedded module according to claim 1, wherein
   the board-side via-conductors, the intermediate via-conductors, and the component-side via-conductors are provided so as not to overlap with one another between adjacent layers within the multilayer board when viewed in a thickness direction of the multilayer board.

8. The electronic component-embedded module according to claim 1 further comprising:
   a pattern conductor provided between the electronic component and the board-side resin layer and partially overlapping with the electronic component when viewed in a direction perpendicular to a top surface of the multilayer board.

9. The electronic component-embedded module according to claim 1, wherein
   another electronic component is mounted on a surface of the multilayer board opposite to a surface facing the motherboard.

10. The electronic component-embedded module according to claim 2, wherein
    the electronic component has two opposite surfaces in a direction of lamination of the intermediate resin layer and the component-side resin layer, and the electronic component is connected to the second component-side via-conductors via a plurality of wiring electrodes formed on one of the two surfaces, and
    the other of the two surfaces is not fixed to the intermediate resin layer having the cavity provided therein.

11. The electronic component-embedded module according to claim 3, wherein
    the electronic component has two opposite surfaces in a direction of lamination of the intermediate resin layer and the component-side resin layer, and the electronic component is connected to the second component-side via-conductors via a plurality of wiring electrodes formed on one of the two surfaces, and
    the other of the two surfaces is not fixed to the intermediate resin layer having the cavity provided therein.

12. The electronic component-embedded module according to claim 2, wherein
    a plurality of cavities is formed in the multilayer board, and
    an electronic component is placed in each of the cavities.

13. The electronic component-embedded module according to claim 3, wherein
a plurality of cavities is formed in the multilayer board, and
an electronic component is placed in each of the cavities.

14. The electronic component-embedded module according to claim 4, wherein
a plurality of cavities is formed in the multilayer board, and
an electronic component is placed in each of the cavities.

15. The electronic component-embedded module according to claim 5, wherein
a plurality of cavities is formed in the multilayer board, and
an electronic component is placed in each of the cavities.

16. The electronic component-embedded module according to claim 2, wherein
the board-side via-conductors, the intermediate via-conductors, and the component-side via-conductors are provided so as not to overlap with one another between adjacent layers within the multilayer board when viewed in a thickness direction of the multilayer board.

17. The electronic component-embedded module according to claim 3, wherein
the board-side via-conductors, the intermediate via-conductors, and the component-side via-conductors are provided so as not to overlap with one another between adjacent layers within the multilayer board when viewed in a thickness direction of the multilayer board.

18. The electronic component-embedded module according to claim 4, wherein
the board-side via-conductors, the intermediate via-conductors, and the component-side via-conductors are provided so as not to overlap with one another between adjacent layers within the multilayer board when viewed in a thickness direction of the multilayer board.

19. The electronic component-embedded module according to claim 5, wherein
the board-side via-conductors, the intermediate via-conductors, and the component-side via-conductors are provided so as not to overlap with one another between adjacent layers within the multilayer board when viewed in a thickness direction of the multilayer board.

20. The electronic component-embedded module according to claim 6, wherein
the board-side via-conductors, the intermediate via-conductors, and the component-side via-conductors are provided so as not to overlap with one another between adjacent layers within the multilayer board when viewed in a thickness direction of the multilayer board.

21. The electronic component-embedded module according to claim 6, wherein the electronic component is connected to the component-side via-conductors only through a top surface of the electronic component, and there is no connection to the component-side via-conductors on a bottom surface of the electronic component.

* * * * *